US006600648B2

(12) United States Patent
Curlee et al.

(10) Patent No.: US 6,600,648 B2
(45) Date of Patent: Jul. 29, 2003

(54) MOUNTING RAIL FOR HARD DISK DRIVE

(75) Inventors: James Don Curlee, Round Rock, TX (US); Robert Duane Hrehor, Jr., Round Rock, TX (US)

(73) Assignee: Dell Products L.P., Round Rock, TX (US)

(*) Notice: Subject to any disclaimer, the term of this patent is extended or adjusted under 35 U.S.C. 154(b) by 52 days.

(21) Appl. No.: 09/901,822

(22) Filed: Jul. 10, 2001

(65) Prior Publication Data

US 2003/0011974 A1 Jan. 16, 2003

(51) Int. Cl.[7] ................................................. G06F 1/16
(52) U.S. Cl. ...................................... 361/685; 312/334.7
(58) Field of Search ............................... 361/685, 799; 439/377; 312/223.2, 334.7

(56) References Cited

U.S. PATENT DOCUMENTS

| 5,112,119 A | * | 5/1992 | Cooke et al. ............... 312/283 |
| 5,233,594 A | | 8/1993 | Wilhelm |
| 5,349,483 A | | 9/1994 | Tsai |
| 5,485,348 A | | 1/1996 | Oros |
| 5,488,538 A | | 1/1996 | Wakita |
| 5,564,804 A | | 10/1996 | Gonzalez et al. |
| 5,654,874 A | | 8/1997 | Suzuki |
| 5,734,557 A | * | 3/1998 | McAnally et al. .......... 361/727 |
| 6,181,565 B1 | | 1/2001 | Schmitt et al. |
| 6,252,766 B1 | | 6/2001 | Radloff |
| 6,297,954 B1 | * | 10/2001 | Seo ............................. 361/686 |
| 6,304,457 B1 | * | 10/2001 | Liu et al. .................... 361/799 |

* cited by examiner

Primary Examiner—Darren Schuberg
Assistant Examiner—Anthony Q. Edwards
(74) Attorney, Agent, or Firm—Haynes and Boone, LLP

(57) ABSTRACT

A shock absorbing mounting rail includes a first rail member formed of a first material. A second rail member is formed of a second material more resilient than the first material. The second rail member is mounted in the first rail member and provides a shock absorbing fastener receptacle and a shock absorbing tip on a first end of the first rail member. A flexible handle is provided on a second end of the first rail member, opposite the first end.

17 Claims, 3 Drawing Sheets

MOUNTING RAIL FOR HARD DISK DRIVE

BACKGROUND

The disclosure herein relates generally to computer systems and more particularly to a hard disk drive (HDD) mounting system to reduce vibration and noise.

Today's customers are requiring quieter computer systems. The HDD is the dominant noise generator in computer systems. While fans are a contributor to the overall sound problems, the HDD generates sound at frequencies that are most bothersome to the user. Eighty percent of the sound generated by HDDs is due to vibration. This vibration propagates from the HDD assembly into the chassis causing the chassis to become an amplifier. The problem is isolating the HDD from the chassis to limit vibration from the HDD being introduced to the chassis.

Present vibration isolation is achieved by adding individual grommets to the mounting points of the HDD. This requires increased assembly time to individually assemble each grommet. Four grommets are required per drive. It also requires an increase in inventory to stock the extra parts. Another method of achieving vibration isolation is the use of laminate metals to create an isolation layer between the main chassis and the drive. The cost of these materials is significantly higher than standard metals. They also limit design freedom due to the difficulty in manufacturing the isolation metals in high volume production.

Therefore, what is needed is a vibration isolating device for mounting the HDD in the chassis.

SUMMARY

One embodiment, accordingly, provides an HDD rail for rapid assembly and removal and for providing vibration and shock protection for the HDD. To this end, a shock absorbing mounting rail includes a rail member formed of a first material and including a fastener receptacle. A shock absorbing fastener receptacle is formed of a second material more resilient than the first material. The shock absorbing fastener receptacle is mounted in the fastener receptacle of the rail member. A shock absorbing tip is formed of the second material and is mounted on a first end of the rail member. A flexible handle is provided on a second end of the rail member, opposite the first end.

A principal advantage of this embodiment is that the HDD is mounted on shock absorbing rails that are easy to install and remove.

DETAILED DESCRIPTION

Figure 1:
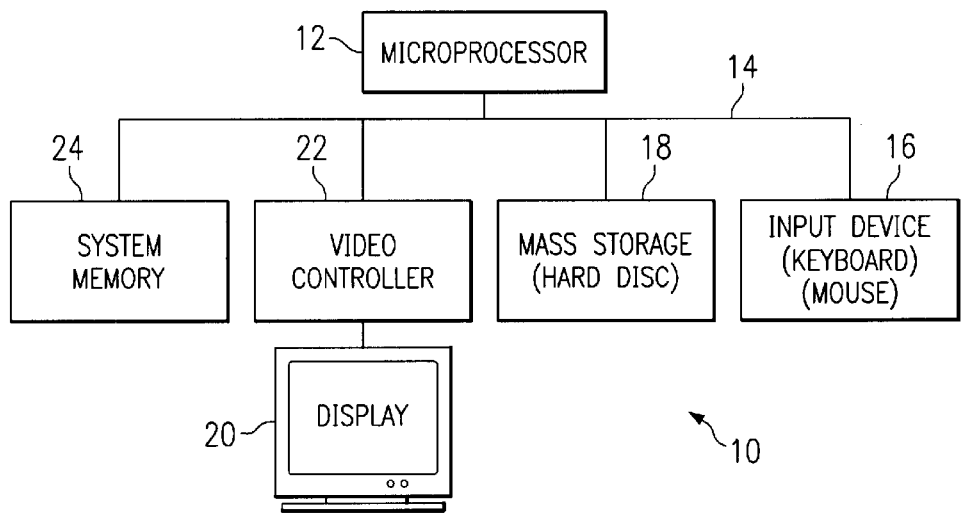
FIG. 1 is a diagrammatic view illustrating an embodiment of a computer system.
Figure 3:
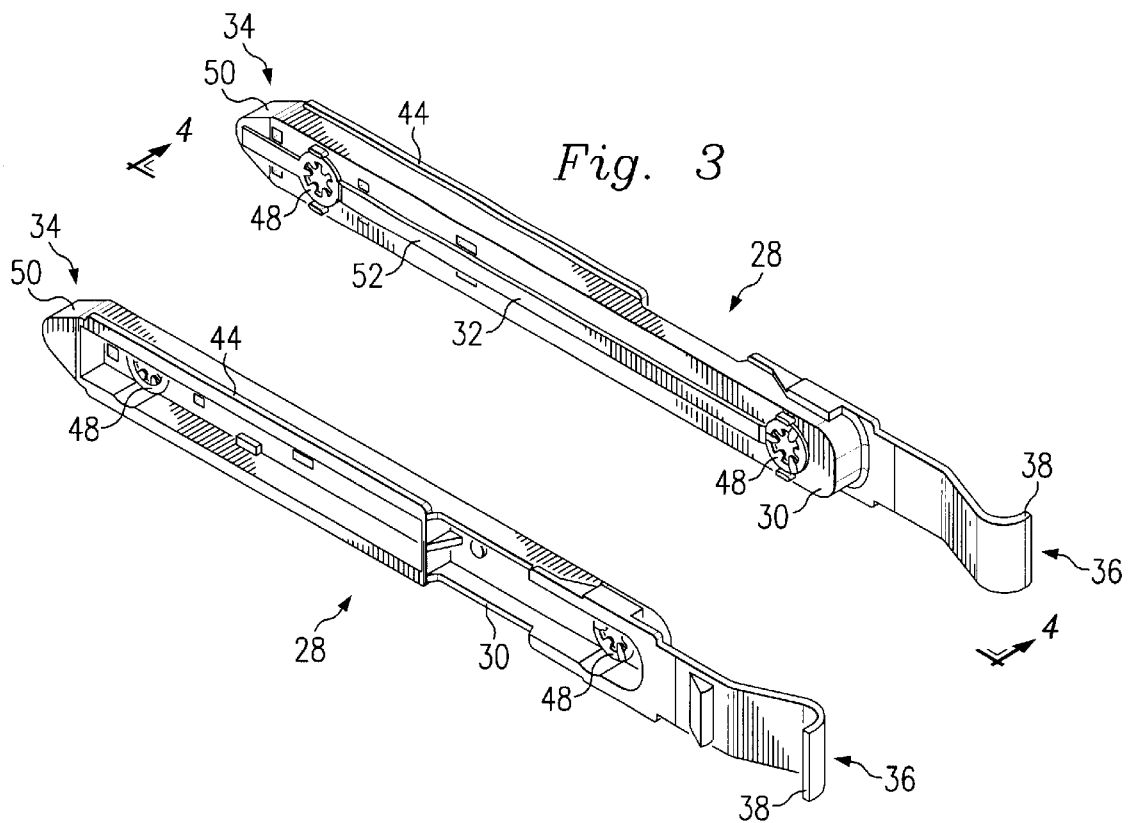
FIG. 3 is a perspective view illustrating an embodiment of a pair of rails.

In one embodiment, computer system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 2:
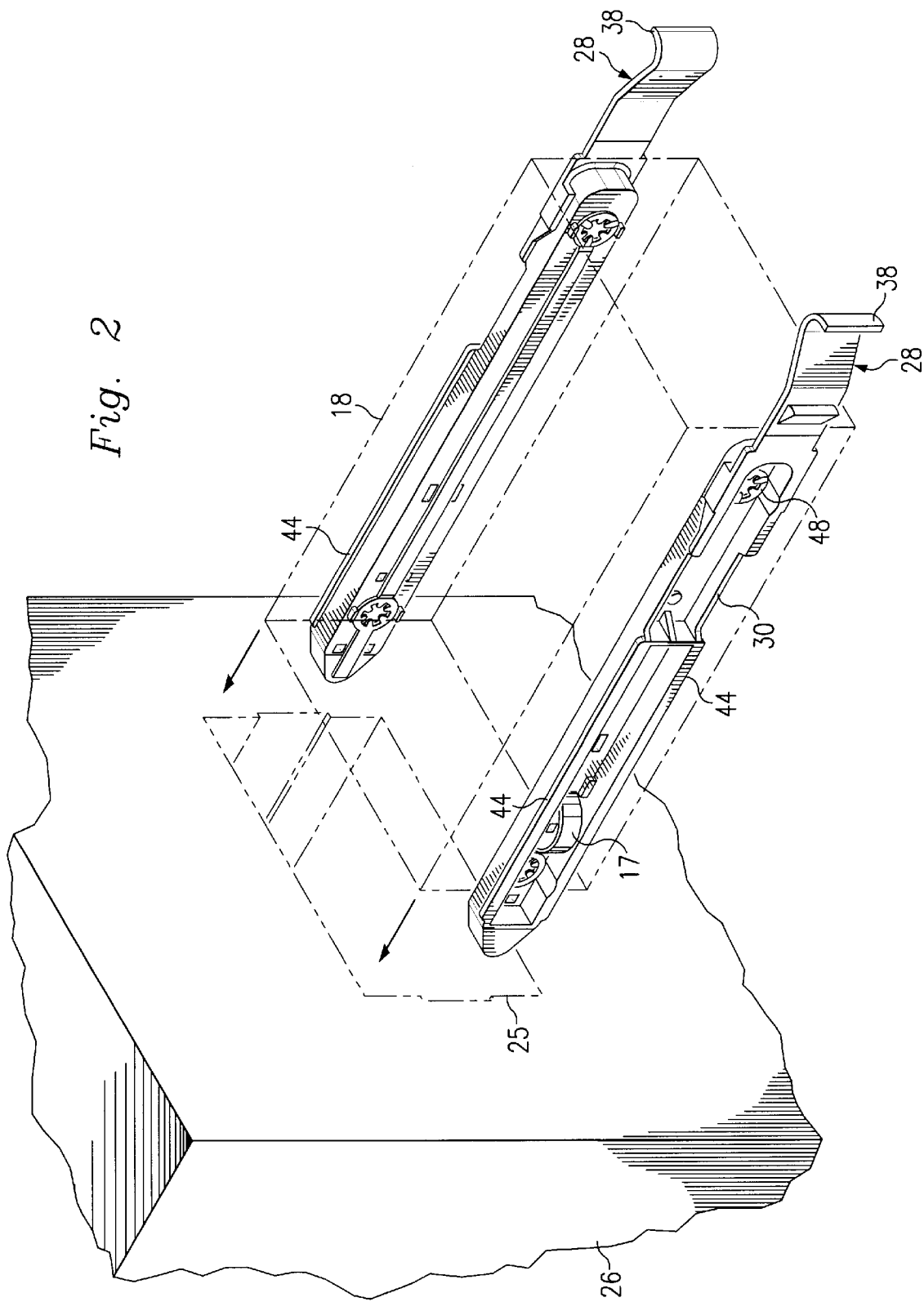
FIG. 2 is a perspective view illustrating an embodiment of rails used to mount an HDD in a chassis.
Figure 4:
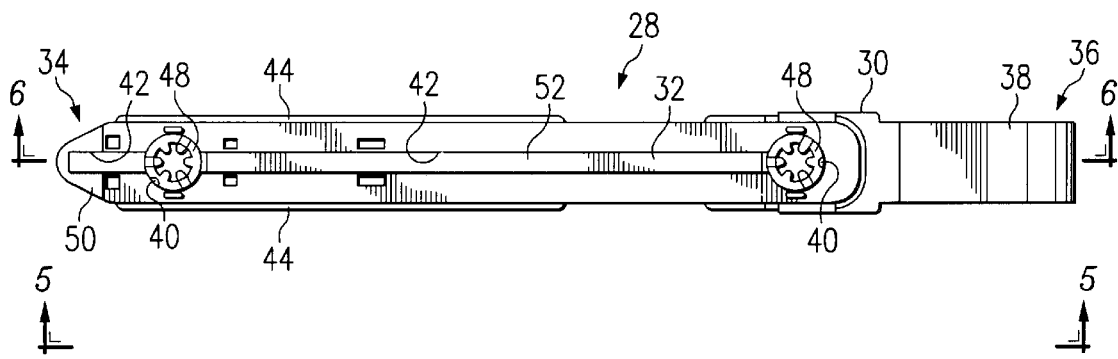
FIG. 4 is a plan view of one of the rails taken along the line 4—4 of FIG. 3.
Figure 5:
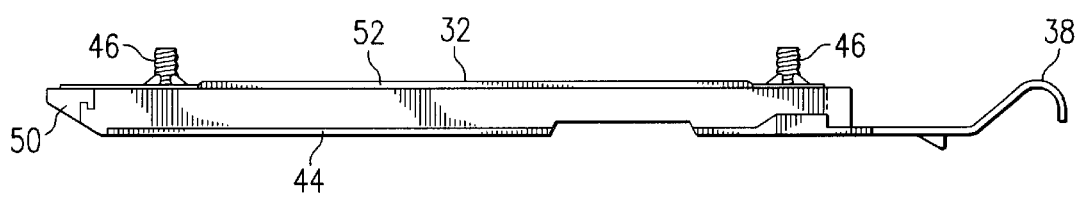
FIG. 5 is side view of the rail taken along line 5—5 of FIG. 4.
Figure 6:
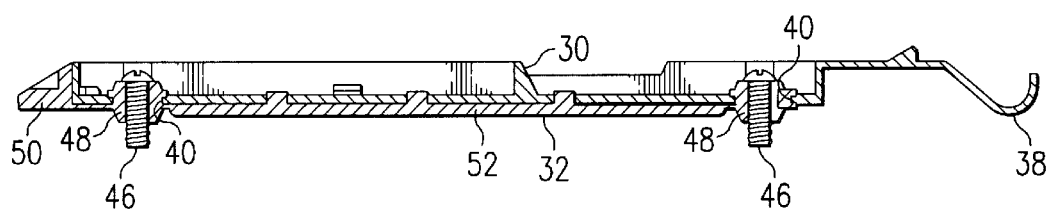
FIG. 6 is a cross-sectional side view of the rail taken along line 6—6 of FIG. 4.

The mass storage 18, FIG. 2, i.e. a hard disk drive (HDD) is slidably mounted in a computer chassis 26 by means of a pair of shock absorbing mounting rails 28. The rails 28 are received in a bay 25 formed in a computer chassis 26. A spring clip 17 is mounted on each rail 28 for providing a spring force between the rail 28 and the chassis 26. The rails 28 are described in more detail below.

The shock absorbing mounting rail is generally designated 28 in FIGS. 3–6. Rail 28 includes a molded, one-piece first rail member 30 formed of a first material such as, for example a tough PC-ABS material. A molded second rail member 32 is formed of a second material which is more resilient than the first material. For example, the second material may be a soft sorbathane thermoplastic. The second rail member 32 is mounted in the first rail member 30, and in fact, is co-molded with the second rail member 32 by a double-shot co-molding process.

The first rail member 28 is an elongated member having a first end 34 and a second end 36, opposite the first end 34. A flexible handle 38 is formed on the second end 36. Preferably, a pair of fastener receptacles 40 are formed in first rail member 30, and a groove 42 is also formed in first rail member 30. Groove 42 may be formed to extend between the fastener receptacles 40 and may also be formed to extend to the first end 34 of the first rail member 30. Also, a pair of guides 44 are formed on first rail member 30 for sliding the rail member 30 into a host, such as the computer chassis 26. The fastener receptacles 40 are provided to accommodate fasteners 46 for securing the rail 28 onto a computer component such as the hard disk drive 18.

The second rail member 32 may be molded as a one-piece member or may be comprised of plural separate members. For example, second rail member 32 may be a one-piece member preferably having a pair of shock absorbing fastener receptacles 48 and a shock absorbing tip 50. The shock absorbing fastener receptacles 48 and the shock absorbing tip 50 may be interconnected by an extension member 52 which seats in groove 42. Tip 50 extends to the first end 34 of the first rail member 30. The shock absorbing fastener receptacles 48 are seated in the fastener receptacles 40. Thus, the fasteners 46 are mounted in the fastener receptacles 40 by means of the shock absorbing fastener receptacles 48 to isolate the HDD 18 from vibration. Also, the shock absorbing tip 50 provides a cushion to isolate the rails 28 and the chassis 26 upon installation. Alternatively, the shock absorbing fastener receptacles 48 may be separate items each mounted in the fastener receptacles 40. Also, the shock absorbing tip 50 may be a separate item mounted on first end 34 of the rail member 30.

In operation, mounting rails 28 are attached to HDD 18 by fasteners 46. HDD 18 is inserted into bay 25 such that the rails 28 are received in the bay via guides 44. Tips 50 may engage a portion of chassis 26 and provide a shock absorber when inserting the HDD 18 into chassis 26. Also, any vibration between chassis 26 and HDD 18 is substantially damped by mounting fasteners 46 in the shock absorbing fastener receptacles 48. Removal of HDD 18 from chassis 26 is facilitated by pinching flexible handles 38 toward each other and pulling the HDD from the chassis 26.

As a result, one embodiment provides a shock absorbing mounting rail comprising a rail member formed of a first material and including a fastener receptacle, a shock absorbing fastener receptacle formed of a second material more resilient than the first material, the shock absorbing fastener receptacle being mounted in the fastener receptacle of the rail member, a shock absorbing tip formed of the second material and mounted on a first end of the rail member, and a flexible handle on a second end of the rail member, opposite the first end.

Another embodiment provides an assembly for mounting a hard disc drive (HDD) assembly in a computer chassis comprising a pair of mounting rails attached to opposite sides of an HDD, each rail including a first rail member formed of a first material and having a flexible handle on one end, and a second rail member formed of a second material more resilient than the first material, the second rail member being mounted in the first rail member and providing a shock absorbing fastener receptacle for receiving a fastener connecting the rail to the HDD and a shock absorbing tip extending to another end of the first rail member opposite the one end.

A further embodiment provides a computer system comprising a chassis, a microprocessor mounted in the chassis, an input coupled to provide input into the microprocessor, a mass storage coupled to the microprocessor, a video controller coupled to the microprocessor, a memory coupled to provide storage to facilitate execution of computer programs by the microprocessor, the storage mounted in the chassis on a rail assembly including a first rail member formed of a first material and a second rail member formed of a second material more resilient than the first material, the second rail member being mounted in the first rail member and providing a shock absorbing fastener receptacle for receiving a fastener connecting the rail assembly to the storage and a shock absorbing tip extending to one end of the first rail member.

As can be seen, the principal advantages of these embodiments are that by using a co-molding process, the HDD rail incorporates a tough PC-ABS material for rapid assembly into the chassis and a soft sorbathane thermoplastic that isolates the drive from the chassis. Combining the two materials eliminates the tedious assembly of individual grommets, increasing the overall manufacturing output significantly. The softer isolation material has been pulled to the tip of the HDD rail protecting the HDD from high G level impulses during the assembly process. This reduces HDD damage in the factory and by the customer.

Although illustrative embodiments have been shown and described, a wide range of modification, change and substitution is contemplated in the foregoing disclosure and in some instances, some features of the embodiment may be employed without a corresponding use of other features. Accordingly, it is appropriate that the appended claims be construed broadly and in a manner consistent with the scope of the embodiments disclosed herein.

What is claimed is:

1. A shock absorbing mounting rail comprising:
   a first rail member formed of a first material and including a fastener receptacle;
   a second rail member including a shock absorbing fastener receptacle formed of a second material more resilient than the first material, the shock absorbing fastener receptacle being mounted in the fastener receptacle of the first rail member;
   a shock absorbing tip on the second rail member connected to the shock absorbing fastener receptacle and formed of the second material and mounted on a first end of the first rail member; and
   a flexible handle on a second end of the rail member, opposite the first end wherein the first rail member includes at least two shock absorbing receptacles interconnected by an expansion member, disposed in a groove extending between the fastener receptacles.

2. The rail as defined in claim 1 wherein the shock absorbing fastener receptacles are connected to the shock-absorbing tip.

3. The rail as defined in claim 2 wherein the extension member is seated in the groove.

4. The rail as defined in claim 3 wherein the two shock absorbing fastener receptacles are seated in the fastener receptacles of the rail member.

5. The rail as defined in claim 1 further comprising:
   a spring clip mounted on the first rail member.

6. An assembly for mounting a hard disc drive (HDD) assembly in a computer chassis comprising:
   a pair of mounting rails attached to opposite sides of an HDD;
   each rail including:
      a first rail member formed of a first material and having a fastener receptacle formed therein and a flexible handle on one end; and
      a second rail member formed of a second material more resilient than the first material, the second rail member being mounted in the first rail member and providing:
         a shock absorbing fastener receptacle mounted in the fastener receptacle of the first rail member for receiving a fastener connecting the rail to the HDD; and
         a shock absorbing tip connected to the shock absorbing fastener receptacle and extending to another end of the first rail member opposite the one end wherein the first rail member includes at least two shock absorbing receptacles interconnected by an extension member, disposed in a groove extending between the fastener receptacles.

7. The assembly as defined in claim 6 wherein the shock absorbing fastener receptacles are connected to the shock absorbing tip.

8. The assembly as defined in claim 7 wherein the extension member is seated in the groove.

9. The assembly as defined in claim 8 wherein the two shock absorbing fastener receptacles of the second rail member are seated in the fastener receptacles of the first rail member.

10. The assembly as defined in claim 6 further comprising:
    a spring clip mounted on the first rail member.

11. A computer system comprising:
    a chassis;
    a microprocessor mounted in the chassis;

an input coupled to provide input into the microprocessor;

a mass storage coupled to the microprocessor;

a video controller coupled to the microprocessor;

a memory coupled to the microprocessor;

the storage mounted in the chassis on a rail assembly including:

a first rail member formed of a first material and including a fastener receptacle; and a second rail member formed of a second material more resilient than the first material, the second rail member being mounted in the first rail member and providing:

a shock absorbing fastener receptacle mounted in the fastener receptacle of the first rail member for receiving a fastener connecting the rail assembly to the storage; and a shock absorbing tip connected to the shock absorbing fastener receptacle and extending to one end of the first rail member wherein the first rail member includes at least two shock absorbing receptacles interconnected by an extension member, disposed in a groove extending between the fastener receptacles.

12. The system as defined in claim 11 wherein the shock absorbing fastener receptacles are connected to the shock absorbing tip.

13. The system as defined in claim 12 wherein the extension member is seated in the groove.

14. The system as defined in claim 13 wherein the two shock absorbing fastener receptacles of the second rail member are seated in the fastener receptacles of the first rail member.

15. The system as defined in claim 11 further comprising:

a spring clip mounted on the first rail member.

16. The system as defined in claim 11 further comprising:

a flexible handle on another end of the first rail member, opposite the one end.

17. A method of making a shock absorbing mounting rail comprising:

molding a first rail member including a fastener receptacle of a first material;

co-molding a second rail member including a shock absorbing fastener receptacle of a second material more resilient than the first material, the second rail member being molded onto the first rail member and the shock absorbing fastener receptacle being mounted in the fastener receptacle; and forming a shock absorbing tip on the second rail member which extends to a terminal end of the first rail member.

\* \* \* \* \*